US012349364B1

(12) United States Patent
Goh et al.

(10) Patent No.: US 12,349,364 B1
(45) Date of Patent: Jul. 1, 2025

(54) MEMORY STRUCTURES AND METHODS OF FORMING THE SAME

(71) Applicant: GlobalFoundries Singapore Pte. Ltd., Singapore (SG)

(72) Inventors: Kian Hui Goh, Singapore (SG); Xinshu Cai, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/786,636

(22) Filed: Jul. 29, 2024

(51) Int. Cl.
| | |
|---|---|
| *H10B 51/30* | (2023.01) |
| *G11C 11/14* | (2006.01) |
| *G11C 11/16* | (2006.01) |
| *G11C 11/22* | (2006.01) |
| *H01L 21/02* | (2006.01) |

(52) U.S. Cl.
CPC ............ *H10B 51/30* (2023.02); *G11C 11/14* (2013.01); *G11C 11/16* (2013.01); *G11C 11/161* (2013.01); *G11C 11/22* (2013.01); *G11C 11/221* (2013.01); *G11C 11/223* (2013.01)

(58) Field of Classification Search
CPC ... G11C 11/22; G11C 11/221; G11C 11/5657; G11C 11/14; G11C 11/16; G11C 11/161; G11C 11/223; H10B 53/00; H10B 51/00; H01L 2924/1441
See application file for complete search history.

(56) References Cited

U.S. PATENT DOCUMENTS

| | | | | |
|---|---|---|---|---|
| 6,013,950 | A * | 1/2000 | Nasby | H10B 53/00 257/295 |
| 11,538,520 | B1 * | 12/2022 | Cheng | G11C 13/0069 |
| 11,996,462 | B2 * | 5/2024 | Prasad | H10D 64/689 |
| 2002/0105016 | A1 * | 8/2002 | Haneder | H10D 30/701 257/295 |
| 2003/0201497 | A1 * | 10/2003 | Inoue | H10B 53/00 257/369 |
| 2004/0245564 | A1 * | 12/2004 | Ogura | H10B 51/30 257/E21.663 |
| 2006/0081901 | A1 * | 4/2006 | Arimoto | H10D 30/701 257/295 |

(Continued)

OTHER PUBLICATIONS

Lee et al., "Hafnium Oxide-Based Ferroelectric Devices for In-Memory Computing: Resistive and Capacitive Approaches", Applied Electronic Materials (Year: 2024).*

(Continued)

*Primary Examiner* — Maliheh Malek
(74) *Attorney, Agent, or Firm* — David Cain

(57) ABSTRACT

A structure including a semiconductor layer having a body region of a first conductivity type and a first electrode including a doped region of a second conductivity type in the semiconductor layer is provided. The doped region is adjacent to the body region. The doped region includes a first portion and a second portion extending laterally from the first portion. The first portion has a first width and the second portion has a second width. The first width is greater than the second width. A ferroelectric layer is arranged on the semiconductor layer over the body region. A second electrode is arranged on the ferroelectric layer. The first portion and the second portion of the doped region partially underlap the second electrode.

20 Claims, 9 Drawing Sheets

(56) References Cited

U.S. PATENT DOCUMENTS

| | | | | |
|---|---|---|---|---|
| 2006/0231880 | A1* | 10/2006 | Yamakawa | H10D 1/688 |
| | | | | 257/306 |
| 2007/0145483 | A1* | 6/2007 | Ono | H10D 30/701 |
| | | | | 257/E21.663 |
| 2010/0123176 | A1* | 5/2010 | Nishimura | H10B 53/10 |
| | | | | 257/295 |
| 2019/0115441 | A1* | 4/2019 | Tan | H10D 64/689 |
| 2019/0212651 | A1* | 7/2019 | Finlay | B05D 3/207 |
| 2019/0346404 | A1* | 11/2019 | Tan | H10D 64/033 |
| 2021/0233587 | A1* | 7/2021 | Lu | H10B 51/40 |
| 2022/0013353 | A1* | 1/2022 | Lu | H10D 64/689 |
| 2022/0351769 | A1* | 11/2022 | Chen | H10B 53/40 |
| 2022/0351776 | A1* | 11/2022 | Nam | G11C 15/046 |
| 2023/0063076 | A1* | 3/2023 | Choi | G11C 11/165 |
| 2023/0189532 | A1* | 6/2023 | Müller | G11C 11/221 |
| | | | | 257/295 |
| 2023/0267977 | A1* | 8/2023 | Vimercati | G11C 7/065 |
| | | | | 365/244 |
| 2023/0292525 | A1* | 9/2023 | Huang | H10B 53/30 |
| 2024/0194253 | A1* | 6/2024 | Parvarandeh | H10D 64/033 |
| 2024/0284680 | A1* | 8/2024 | Zhao | H10D 64/689 |

OTHER PUBLICATIONS

Mukherjee et al. "Capacitive Memory Window With Non-Destructive Read in Ferroelectric Capacitors", IEEE (Year: 2023).*

Yu et al., "Ferroelectric capacitors and field-effect transistors as in-memory computing elements for machine learning workloads", Nature, Scientific Reports (Year: 2024).*

Ryu et al., "Exploring New Metal Electrodes for Ferroelectric Aluminum-Doped Hafnium Oxide" IEEE (Year: 2019).*

Ryu et al., "Ferroelectric Tunneling Junctions Based on Aluminum Oxide/Zirconium-Doped Hafnium Oxide for Neuromorphic Computing", Nature, Scientific Reports (Year: 2019).*

Zuopu Zhou, Jiao Leming, Jiuren Zhou, Zijie Zheng, Yue Chen, Kaizhen Han, Yuye Kang, and Xiao Gong; Experimental Demonstration of An Inversion-Type Ferroelectric Capacitive Memory and its 1 kbit Crossbar Array Featuring High CHCS/CLCS, Fast Speed, and Long Retention; 2022 Symposium on VLSI Technology & Circuits Digest of Technical Papers 357-358; IEEE, Department of Electrical and Computer Engineering, National University of Singapore (NUS), 117576, Singapore.

X. Lyu, M. Si, X. Sun, M. A. Capano, H. Wang, and P. D. Ye; Ferroelectric and Anti-Ferroelectric Hafnium Zirconium Oxide: Scaling Limit, Switching Speed and Record High Polarization Density; 2019 Symposium on VLSI Technology Digest of Technical Papers; School of Electrical and Computer Engineering and School of Materials Science and Engineering, Purdue University, West Lafayette, IN 47907, U.S.A.

Zuopu Zhou, Leming Jiao, Qiwen Kong, Zijie Zheng, Kaizhen Han, Yue Chen, Chen Sun, Bich-Yen Nguyen, and Xiao Gong; Non-Destructive-Read 1T1C Ferroelectric Capacitive Memory Cell with BEOL 3D Monolithically Integrated IGZO Access Transistor for 4F2 High-Density Integration; 2023 IEEE Symposium on VLSI Technology and Circuits Digest of Technical Papers; Department of Electrical and Computer Engineering, National University of Singapore (NUS), 117576, Singapore, Soitec, 38190 Bernin, France.

Mulaosmanovic, H., et al. "Novel ferroelectric FET based synapse for neuromorphic systems." 2017 Symposium on VLSI Technology. IEEE, 2017.

Min-Kyu Kim, Ik-Jyae Kim, Jang-Sik Lee; CMOS-compatible ferroelectric NAND flash memory for high-density, low-power, and high-speed three-dimensional memory; Science Advances, Jan. 13, 2021; Department of Materials Science and Engineering, Pohang University of Science and Technology (POSTECH), Pohang 37673, Korea.

* cited by examiner

100

100

200

200

500

500

500

500

MEMORY STRUCTURES AND METHODS OF FORMING THE SAME

TECHNICAL FIELD

The present disclosure relates generally to semiconductor devices, and more particularly to structures for non-volatile memory devices and methods of forming structures for non-volatile memory devices.

BACKGROUND

Non-volatile memory devices such as a ferroelectric capacitive memory device holds information in the form of polarization of a layer of ferroelectric material. A ferroelectric capacitor employed in a ferroelectric capacitive memory device may include the layer of ferroelectric material arranged between a pair of electrodes that may be used to apply a bidirectional electric field. The ferroelectric capacitor may be selectively switched by the bidirectional electric field between a high capacitance state and a low capacitance state. The high capacitance state and the low capacitance state may represent different net polarization states of the ferroelectric material. The different capacitance states may be used to program the memory device with non-volatile binary logic states. As electronic products are used to perform computing tasks which are increasingly data intensive, it is desirable to provide improved structures for non-volatile memory devices, such as the ferroelectric capacitive memory device, with low power consumption, fast program and erase speed and good reliability.

SUMMARY

According to various embodiments, a structure including a semiconductor layer having a body region of a first conductivity type and a first electrode including a doped region of a second conductivity type in the semiconductor layer is provided. The doped region is adjacent to the body region. The doped region includes a first portion and a second portion extending laterally from the first portion. The first portion has a first width and the second portion has a second width. The first width is greater than the second width. A ferroelectric layer is arranged on the semiconductor layer over the body region. A second electrode is arranged on the ferroelectric layer. The first portion and the second portion of the doped region partially underlap the second electrode.

According to another aspect, a structure including a semiconductor layer having a body region of a first conductivity type and a doped region of a second conductivity type in the semiconductor layer is provided. The doped region is adjacent to the body region. The doped region includes a first portion and a second portion extending laterally from the first portion. The first portion has a first width and the second portion has a second width. The first width is greater than the second width. A dielectric is arranged on the semiconductor layer over the body region. An electrode is arranged on the dielectric. The first portion and the second portion of the doped region partially underlap the electrode.

According to another aspect, a method of forming a structure is provided. The method may include forming a first electrode including a doped region of a second conductivity type in a semiconductor layer, where the doped region is adjacent to a body region of a first conductivity type in the semiconductor layer. The doped region includes a first portion and a second portion extending laterally from the first portion. The first portion has a first width and the second portion has a second width. The first width is greater than the second width. The method may further include forming a ferroelectric layer on the semiconductor layer over the body region, and forming a second electrode on the ferroelectric layer. The first portion and the second portion of the doped region partially underlap the second electrode.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Figure 1A:
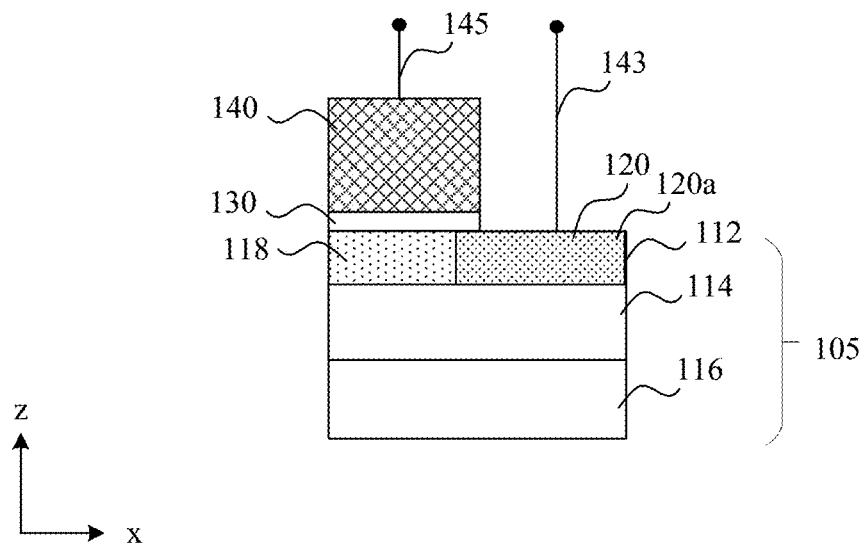
FIGS. 1A-1B illustrate cross-sectional and top views, respectively, of an embodiment of a structure.

FIGS. 1A-1D illustrate an exemplary embodiment of a structure 100. FIG. 1A shows a cross-sectional view of the embodiment of the structure 100. The structure 100 may be a memory structure for a non-volatile memory device. In one embodiment, the memory device may be a ferroelectric capacitive memory device. Other types of memory devices may also be applicable. For example, in other embodiments, the memory structure may be employed in SONOS memory devices.

The structure 100 may include a semiconductor substrate 105, such as a crystal-on-insulator (COI) (e.g., silicon-on-insulator (SOI)) substrate. The substrate 105 may include a device layer 112, an insulator layer 114 and a base layer 116. The device layer 112 and the base layer 116 may be semiconductor layers. For example, the device layer 112 and the base layer 116 may be formed of a semiconductor material, such as silicon, silicon germanium, germanium, and the insulator layer 114 may be formed of a dielectric material such as silicon oxide. Other types of substrates, such as a bulk semiconductor substrate may also be used. In the case of a bulk substrate, the device layer 112, for example, may be an upper portion of the substrate 105. The device layer 112 may include a body region 118 of a first conductivity type.

A first electrode which includes a doped region 120 of a second conductivity type may be arranged in the device layer 112. The doped region 120 is adjacent to the body region 118. The doped region 120 and the body region 118 may be of the opposite polarity type. In one embodiment, the first conductivity type may be p-type, while the second conductivity type may be n-type. In one embodiment, the doped region 120 may include n-type dopants such as phosphorus, arsenic, or any other suitable dopants, while body region may include p-type dopants such as boron, gallium, indium, or any other suitable dopants. The doped region 120 may have a higher dopant concentration than the body region 118. For example, the body region 118 may be lightly doped with dopants of the first conductivity type, while the doped region 120 may be heavily doped with dopants of the second conductivity type. For example, the body region 118 may have a dopant concentration ranging from about $10^{17}$ cm$^{-3}$ to about $10^{18}$ cm$^{-3}$. The doped region 120, for example, may have a dopant concentration greater than $10^{18}$ cm$^{-3}$. The doped region 120 having the heavily doped dopants, for example, may facilitate switching of a ferroelectric layer 130.

In one embodiment, a layer 130 of ferroelectric material may be arranged on the device layer 112. The layer 130 of ferroelectric material may be interchangeably referred to herein as ferroelectric layer 130. The ferroelectric layer 130 may overlap the body region 118. The ferroelectric layer 130 may be formed of a ferroelectric material, such as aluminum-doped hafnium oxide (HfAlO$_x$) or lead zirconate titanate (PZT). The ferroelectric layer 130, for example, may include crystalline grains characterized by an orthorhombic phase that exhibits ferroelectricity. In one embodiment, the structure 100 may hold information in the form of polarization of the ferroelectric layer 130. In one embodiment, the ferroelectric layer 130 may directly contact the device layer 112. In other embodiments, a dielectric 130 may be arranged on the device layer 112 over the body region 118. For example, the dielectric 130 may be a dielectric stack such as an oxide-nitride-oxide employed in SONOS memory devices.

In one embodiment, a second electrode 140 may be arranged on the ferroelectric layer 130. In one embodiment, the second electrode 140 may directly contact the ferroelectric layer 130. In the case where a dielectric 130 is provided, the second electrode 140 may be arranged on the dielectric 130, and the second electrode 140 may directly contact the dielectric 130. The second electrode 140 may be formed of a conductive material, for example, such as polysilicon, copper. The doped region 120 may partially underlap the second electrode 140. The doped region 120 (or first electrode) may be coupled to interconnect 143, while the second electrode 140 may be coupled to interconnect 145. The electrical polarization of the ferroelectric layer 130 may be reversed by the application of electric field to the first and second electrodes.

Figure 1B:
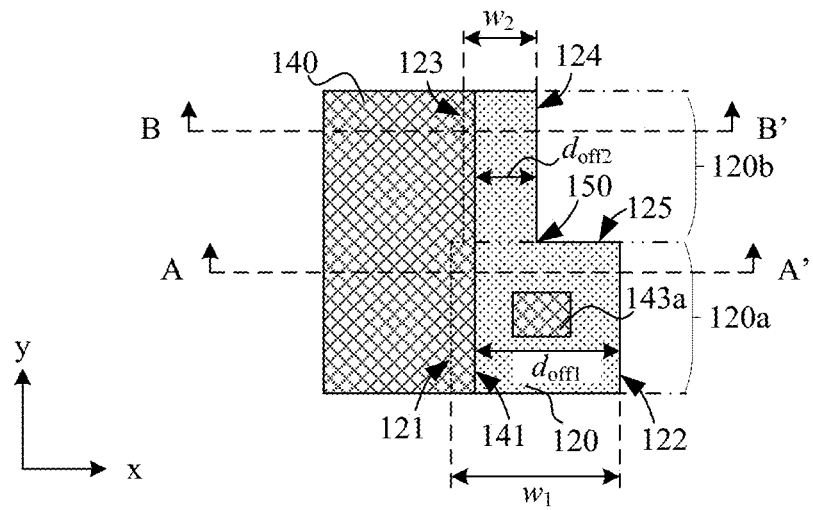

FIG. 1B shows a top view of the embodiment of the structure 100. The doped region 120 and the second electrode 140 of the structure shown in FIG. 1A, for example, may correspond to a section taken along line A-A' in FIG. 1B.

Figure 1C:
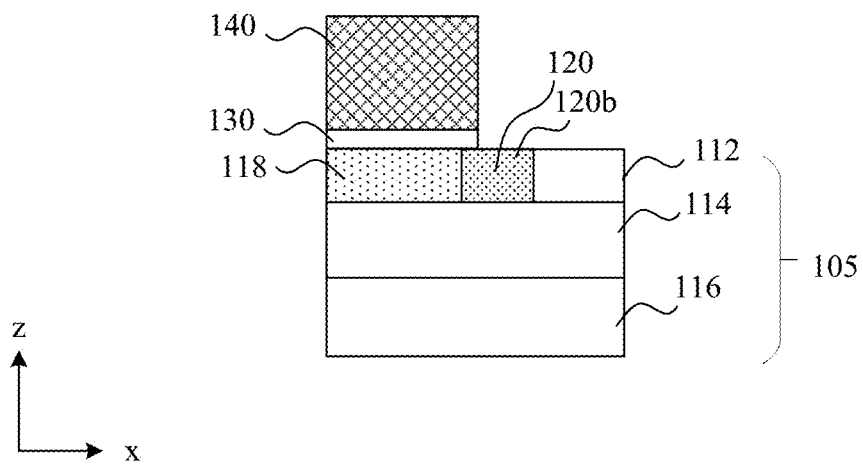
FIG. 1C shows another cross-sectional view of the embodiment of the structure.

In one embodiment, the doped region 120 may include a first portion 120a and a second portion 120b extending laterally from the first portion 120a. The second portion 120b, for example, may extend from the first portion 120a in a first direction. The first portion 120a and the second portion 120b of the doped region 120 each may partially underlap the second electrode 140. The first portion 120a of the doped region 120 may include opposing side surfaces 121 and 122. The side surface 121 of the first portion 120a underlaps the second electrode 140 (as indicated by the dotted line in FIG. 1B), while the side surface 122 of the first portion 120a does not underlap the second electrode 140. The second portion 120b of the doped region 120 may include opposing side surfaces 123 and 124. The side surface 123 of the second portion 120b underlaps the second electrode 140 (as indicated by the dotted line in FIG. 1B), while the side surface 124 of the second portion 120b does not underlap the second electrode 140. The first portion 120a may have a first width $w_1$ taken from the side surface 121 to the side surface 122 of the first portion 120a, while the second portion 120b may have a second width $w_2$ taken from the side surface 123 to the side surface 124 of the second portion 120b. The first width $w_1$ and the second width $w_2$ may be taken in a second direction. The first direction and the second direction may be parallel to a top surface of the device layer 112. In one embodiment, the second direction may be perpendicular to the first direction. For example, the first direction may be along a y-axis direction and the second direction may be along an x-axis direction, as illustrated in FIG. 1B. Alternatively, in other embodiments, the first direction may be along the x-axis direction and the second direction may be along the y-axis direction. In one embodiment, the first width $w_1$ is greater than the second width $w_2$. In one embodiment, the side surface 122 of the first portion 120a and the side surface 124 of the second portion 120b of the doped region 120 may be laterally offset from a sidewall of the second electrode 140 by different distances. As illustrated in FIG. 1B, the side surface 122 of the first portion 120a may be laterally offset from sidewall 141 of the second electrode 140 by a first offset distance $d_{off1}$, while the side surface 124 of the second portion 120b may be laterally offset from the sidewall 141 of the second electrode 140 by a second offset distance $d_{off2}$. In one embodiment, the side surface 122 of the first portion 120a may be laterally offset from the sidewall 141 of the second electrode 140 at a greater distance than the side surface 124 of the second portion 120b. In other words, the first offset distance $d_{off1}$ of the first portion 120a is greater than the second offset distance $d_{off2}$ of the second portion 120b. For example, the side surface 122 of the first portion 120a may laterally offset from the sidewall 141 of the second electrode 140 by a distance of about 0.5 μm, while the side surface 124 of the second portion 120b may be laterally offset from the sidewall 141 of the second electrode 140 by a distance of about 0.05 μm. A side surface 125 of the first portion 120a may extend in the second direction (e.g., along the x-axis direction) and may be perpendicular to the side surface 122 of the first portion 120a. The side surface 125 of the first portion 120a may adjoin the side surface 124 of the second portion 120b to form an edge or corner portion 150 of the doped region 120. The side surface 125 of the first portion 120a, the side surface 124 of the second portion 120b and the edge portion 150 of the doped region 120 does not underlap the second electrode 140. In one embodiment, the first portion and the second portion 120a and 120b may constitute an L-shaped configuration (e.g., in plan view) of the doped region 120. FIG. 1C shows a cross-sectional view of the embodiment of the structure 100 taken along line B-B' in FIG. 1B. The second portion 120b of the doped region 120 as illustrated may have a width which is less than a width of the first portion 120a of the doped region 120 illustrated in FIG. 1A.

Figure 1D:
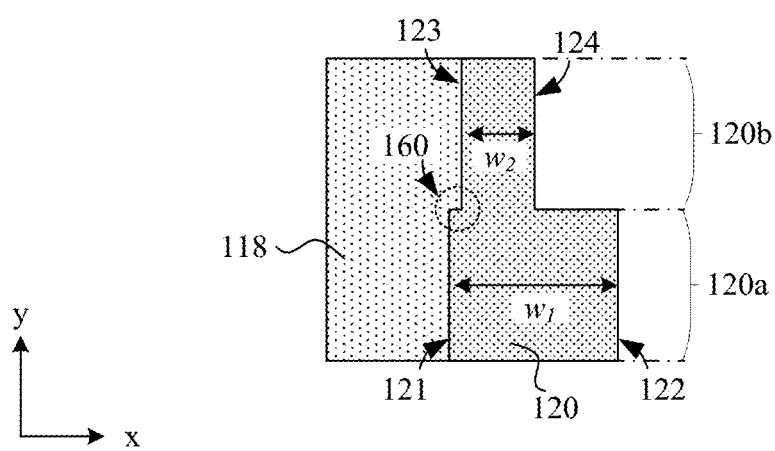
FIG. 1D shows another exemplary top view of the structure.

In one embodiment, the first electrode having the doped region 120 may serve as a bottom electrode of a ferroelectric capacitive memory device, and the second electrode 140 may serve as a top electrode of the ferroelectric capacitive memory device. Referring back to FIG. 1A, an interconnect 143 may be coupled to the doped region 120, and an interconnect 145 may be coupled to the second electrode 140. The interconnect 143 and 145 may include metal layers and via contacts, for example, formed by a back-end-of-line (BEOL) process. In one embodiment, a contact 143a of interconnect 143 may be arranged over the first portion 120a of the doped region 120, as illustrated in FIG. 1B. FIG. 1D illustrates an exemplary top view of the structure 100 without illustrating the second electrode 140 and ferroelectric layer 130 (or dielectric layer 130). For example, FIG. 1D further illustrates sections of the first portion 120a and the second portion 120b of the doped region 120 beneath the second electrode 140. The first portion 120a of the doped region 120 may be laterally diffused to a greater extent beneath the second electrode 140 than the second portion 120b of the doped region during the anneal process for forming the doped region 120, producing corner 160 beneath the second electrode 140. Accordingly, the side surface 121 of the first portion 120a and the side surface 123 of the second portion 120b of the doped region 120 beneath the second electrode 140 may be non-aligned.

As described, various embodiments provide a doped region of a memory structure having at least one portion with a width which is less than a width of another portion (e.g., the first portion having the first width $w_1$ which is greater than the second width $w_2$ of the second portion). In one embodiment, the doped region may serve as the bottom electrode of the memory structure and the doped region may partially underlap a top electrode of the memory structure. The doped region having portions with different widths and which partially underlap the top electrode may advantageously increase band-to-band tunneling (BTBT) in the memory structure when bias is applied to the first electrode and the second electrode, which enhances the switching speed, for example, from the high capacitance state to the low capacitance state of the memory device. The band-to-band tunneling may be increased, for example, by enhanced electrical field effect due to the corner 160 beneath the second electrode 140 produced by the doping profile of the laterally diffused doped region 120.

Figure 2A:
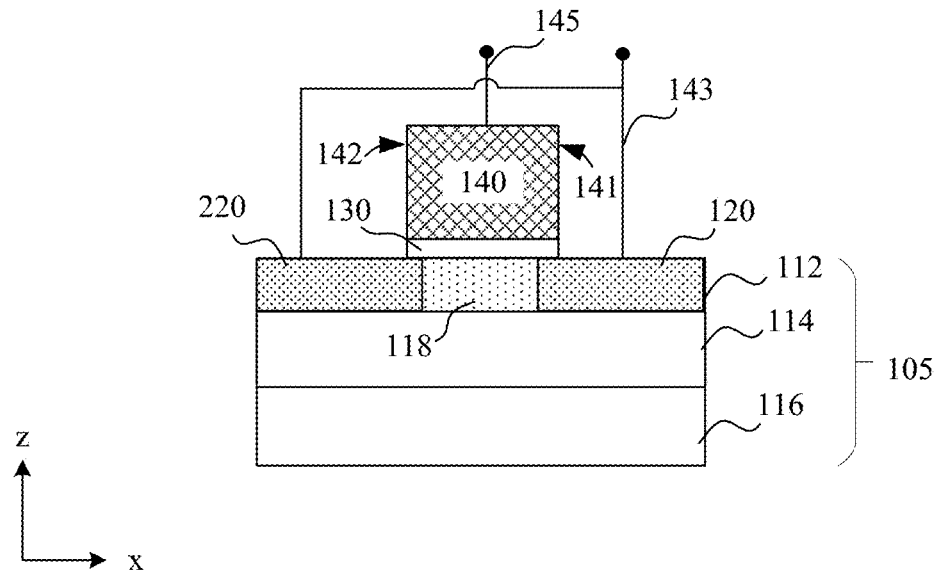
FIGS. 2A-2D illustrate cross-sectional and top views of various exemplary embodiments of a structure.
Figure 2B:
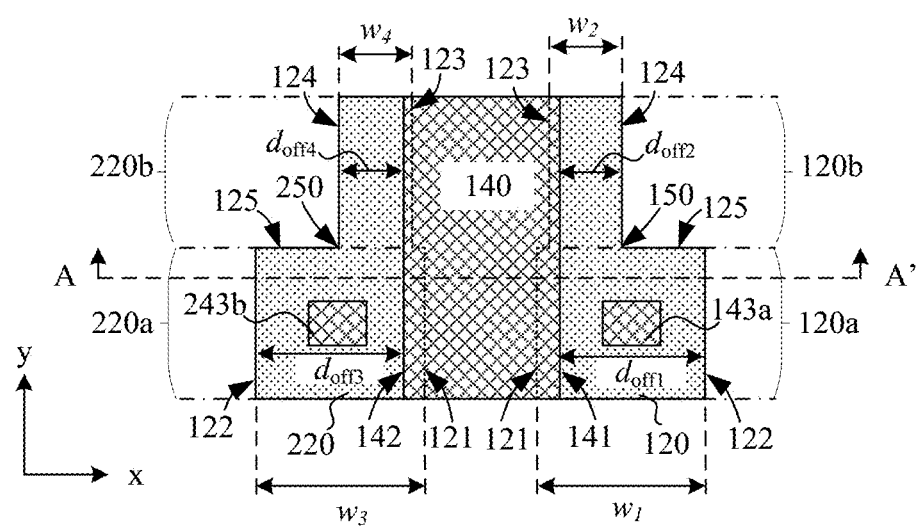
Figure 2C:
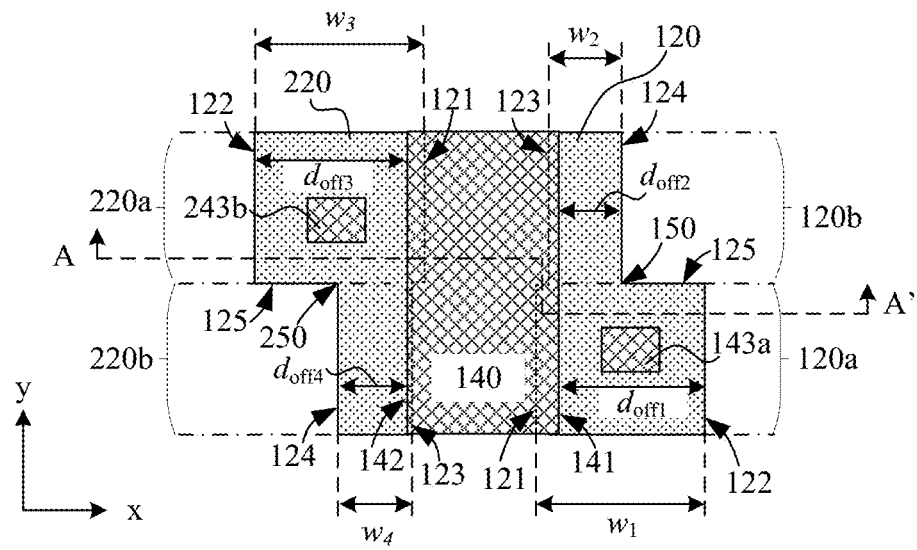
Figure 2D:
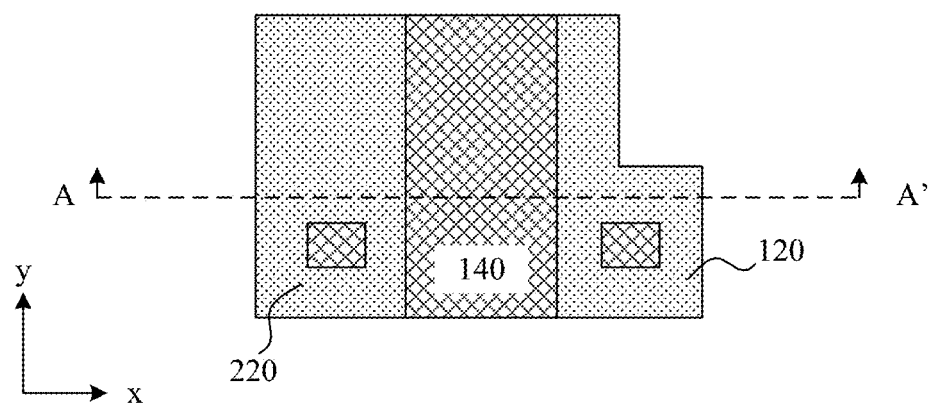

FIGS. 2A-2D illustrate various exemplary embodiments of a structure 200, according to various aspects of the invention. Structure 200 may include features similar to that of structure 100 shown in FIGS. 1A-1D and like numerals in FIGS. 1A-1D may denote like features in FIGS. 2A-2D. FIG. 2A shows a cross-sectional view of an embodiment of the structure 200. FIGS. 2B-2D show top views of various embodiments of the structure 200. The structure shown in FIG. 2A, for example, may correspond to a section taken along line A-A' in FIGS. 2B-2D.

Referring to FIG. 2A, the structure 200 may be similar to the structure 100 in FIGS. 1A-1D, but the first electrode may further include a second doped region 220 arranged in the device layer 112. For example, the doped region 120 is adjacent to sidewall 141 of the second electrode 140, and the second doped region 220 is adjacent to sidewall 142 opposite to the sidewall 141 of the second electrode 140. The doped region 120 may partially underlap the sidewall 141 of the second electrode 140, and the second doped region 220 may partially underlap the sidewall 142 of the second electrode 140. The doped region 120 and the second doped region 220 of the first electrode may have the same conductivity type. For example, the doped region 120 and the second doped region 220 of the first electrode may have the second conductivity type, while the body region 118 between the doped region 120 and the second doped region 220 may have the first conductivity type. The second doped region 220 may be separated from the doped region 120 by the body region 118. The doped region 120 and the second doped region 220, in one embodiment, may serve as the bottom electrode of the memory structure and may be commonly coupled to the same terminal. The doped region 120 and the second doped region 220 may be coupled to interconnect 143 and the second electrode 140 may be coupled to interconnect 145.

Referring to FIGS. 2B-2C, the second doped region 220 may include a first portion 220a and a second portion 220b extending laterally from the first portion 220a. The second portion 220b, for example, may extend from the first portion 220a in the first direction. The first portion 220a and the second portion 220b of the second doped region 220 each may partially underlap the second electrode 140. The first portion 220a of the doped region 220 may include opposing side surfaces 121 and 122. The second portion 220b of the doped region 220 may include opposing side surfaces 123 and 124. The side surface 121 of the first portion 220a and the side surface 123 of the second portion 220b underlap the second electrode 140 (as indicated by the dotted lines in FIG. 2B, FIG. 2C). The side surface 122 of the first portion 220a and the side surface 124 of the second portion 220b does not underlap the second electrode 140. The first portion 220a may have a third width $w_3$ taken from the side surface 121 to the side surface 122 of the first portion 220a and the second portion 220b may have a fourth width $w_4$ taken from the side surface 123 to the side surface 124 of the second portion 220b. The third width $w_3$ and the fourth width $w_4$ may be taken in the second direction. In one embodiment, the third width $w_3$ is greater than the fourth width $w_4$. The first direction and the second direction may be parallel to the top surface of the device layer 112. In one embodiment, the second direction may be perpendicular to the first direction. In one embodiment, the side surface 122 of the first portion 220a and the side surface 124 of the second portion 220b of the second doped region 220 may be laterally offset from the sidewall 142 of the second electrode 140 by different distances. As illustrated in FIG. 2B and FIG. 2C, the side surface 122 of the first portion 220a may be laterally offset from sidewall 142 of the second electrode 140 by a third offset distance $d_{off3}$, while the side surface 124 of the second portion 220b may be laterally offset from the sidewall 142 of the second electrode 140 by a fourth offset distance $d_{off4}$. The side surface 122 of the first portion 220a may be laterally offset from the sidewall 142 of the second electrode 140 at a greater distance than the side surface 124 of the second portion 220b. In other words, the third offset distance $d_{off3}$ of the first portion 220a is greater than the fourth offset distance $d_{off4}$ of the second portion 220b. A side surface 125 of the first portion 220a may extend in the second direction (e.g., along the x-axis direction) and may be perpendicular to the side surface 122 of the first portion 220a. The side surface 125 of the first portion 220a may adjoin the side surface 124 of the second portion 220b to form an edge or corner portion 250 of the doped region 220. The side surface 125 of the first portion 220a, the side surface 124 of the second portion 220b and the edge portion 250 of the second doped region 220 does not underlap the second electrode 140. In one embodiment, the first portion and the second portion 220a and 220b may constitute an L-shaped configuration (e.g., in plan view) of the second doped region 220. In one embodiment, a contact 243b of interconnect 143 may be arranged over the first portion 220a of the second doped region 220.

In one embodiment, the doped region 120 and the second doped region 220 may be arranged symmetrical to each other, for example with respect to a longitudinal axis (e.g., along the y-axis as illustrated in FIG. 2B) extending through a center of the second electrode 140. In another embodiment as illustrated in FIG. 2C, the doped region 120 and the second doped region 220 may be arranged asymmetrical to each other with respect to a longitudinal axis (e.g., along the y-axis as illustrated in FIG. 2C) extending through a center of the second electrode 140. For example, in plan view, the first portion 120a of the doped region 120 (having a width which is greater than a width of the second portion 120b of the doped region 120) and the first portion 220a of the second doped region 220 (having a width which is greater than a width of the second portion 220b of the second doped region 220) may be positioned diagonal to each other. In another embodiment, the second doped region 220 may have a uniform configuration, such as a rectangular block, as illustrated in FIG. 2D.

FIGS. 3A-3D illustrate top views of various exemplary embodiments of a structure 300, according to various aspects of the invention. Structure 300 may include features similar to that of structure 100 shown in FIGS. 1A-1D and like numerals in FIGS. 1A-1D may denote like features in FIGS. 3A-3D. Similar to the first electrode of the structure 100, the first electrode of the structure 300 may include the doped region 120 arranged in the device layer 112.

Figure 3A:
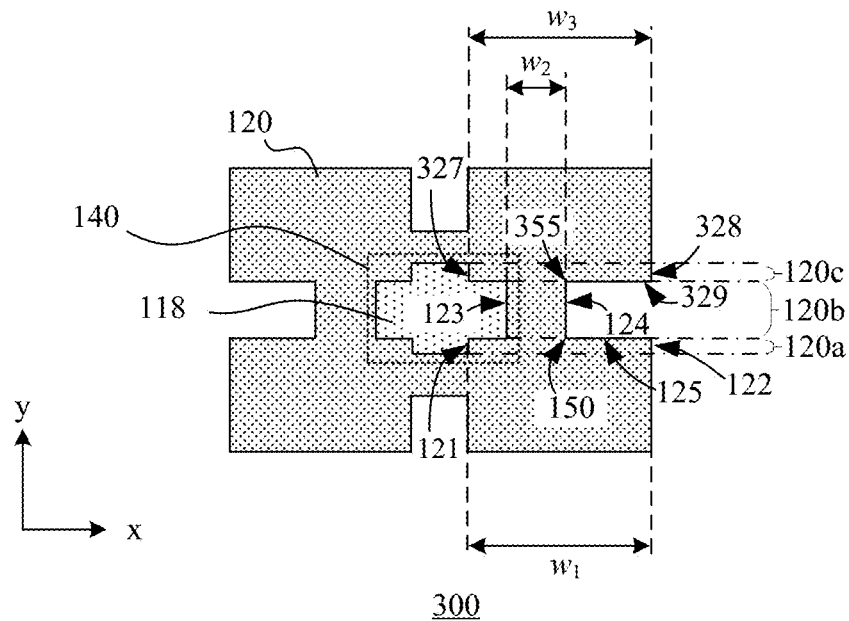
FIGS. 3A-3D illustrate exemplary top views of various other embodiments of a structure.
Figure 3B:
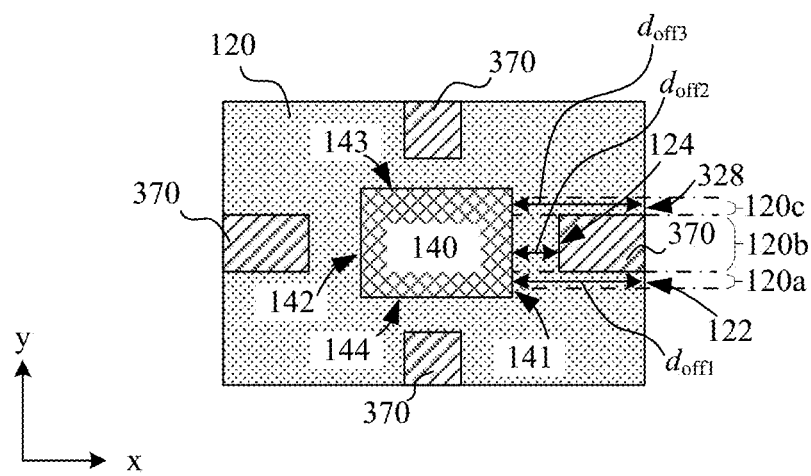

The doped region 120 may include first portion 120a and second portion 120b extending laterally from the first portion 120a in the first direction (e.g., along a y-axis direction). In one embodiment, the doped region 120 may further include a third portion 120c. Referring to FIGS. 3A and 3B, the third portion 120c may be adjacent to the second portion 120b. The second portion 120b, in one embodiment, may be positioned between the first portion 120a and the third portion 120c. The first, second and third portions 120a, 120b and 120c of the doped region 120 each may partially underlap the second electrode 140 (second electrode 140 indicated by dotted lines in FIG. 3A). Referring to FIG. 3A, the first portion 120a of the doped region 120 may include opposing side surfaces 121 and 122, the second portion 120b of the doped region 120 may include opposing side surfaces 123 and 124, and the third portion 120c may include opposing side surfaces 327 and 328. The side surface 121 of the first portion 120a, the side surface 123 of the second portion 120b and the side surface 327 of the third portion 120c underlaps the second electrode 140. The side surface 122 of the first portion 120a, the side surface 124 of the second portion 120b and the side surface 328 of the third portion 120c does not underlap the second electrode 140. The first portion 120a may have a first width $w_1$ taken from the side surface 121 to the side surface 122 of the first portion 120a, the second portion 120b may have a second width $w_2$ taken from the side surface 123 to the side surface 124 of the second portion 120b, while the third portion 120c may have a third width $w_3$ taken from the side surface 327 to the side surface 328 of the third portion 120c. The first width $w_1$, the second width $w_2$ and the third width $w_3$ may be taken in the second direction. In one embodiment, the first width $w_1$ of the first portion 120a and the third width $w_3$ of the third portion 120c each may be greater than the second width $w_2$ of the second portion 120b. As illustrated in FIG. 3A, the side surface 121 of the first portion 120a, the side surface 123 of the second portion 120b and the side surface 327 of the third portion 120c of the doped region 120 beneath the second electrode 140 may be non-aligned. In one embodiment, the side surface 122 of the first portion 120a, the side surface 124 of the second portion 120b and the side surface 328 of the third portion 120c may be laterally offset from a sidewall of the second electrode 140 by different distances. Referring to FIG. 3B, the side surface 122 of the first portion 120a may be laterally offset from sidewall 141 of the second electrode 140 by a first offset distance $d_{off1}$, the side surface 124 of the second portion 120b may be laterally offset from the sidewall 141 of the second electrode 140 by a second offset distance $d_{off2}$, and the side surface 328 of the third portion 120c may be laterally offset from the sidewall 141 of the second electrode 140 by a third offset distance $d_{off3}$. The side surface 122 of the first portion 120a and the side surface 328 of the third portion 120c may be laterally offset from the sidewall 141 of the second electrode 140 at a greater distance than the side surface 124 of the second portion 120b. In other words, the first offset distance $d_{off1}$ of the first portion 120a and the third offset distance $d_{off3}$ of the third portion 120c are greater than the second offset distance $d_{off2}$ of the second portion 120b. Referring to FIG. 3A, the side surface 125 of the first portion 120a may extend in the second direction (e.g., along the x-axis direction) and may be perpendicular to the side surface 122 of the first portion 120a. The side surface 125 of the first portion 120a may adjoin the side surface 124 of the second portion 120b to form the edge portion 150 of the doped region 120. A side surface 329 of the third portion 120c may extend in the second direction (e.g., along the x-axis direction) and may be perpendicular to the side surface 328 of the third portion 120c. The side surface 329 of the third portion 120c may adjoin the side surface 124 of the second portion 120b to form an edge portion 355 of the doped region 120. The side surface 125 of the first portion 120a, the side surface 124 of the second portion 120b, the side surface 329 of the third portion 120c, the edge portion 150 and the edge portion 355 of the doped region 120 does not underlap the second electrode 140. A contact of an interconnect may be arranged on the doped region 120, such as over other portions of the doped region 120 (not shown).

In one embodiment, the second electrode 140 has opposing sidewalls 141 and 142, and opposing sidewalls 143 and 144 and the doped region 120 underlaps each of the sidewalls 141, 142, 143 and 144 of the second electrode 140.

The doped region 120 may further include respective portions having side surfaces which are laterally offset from the respective sidewalls 142, 143, and 144 of the second electrode 140 by different distances. In one embodiment, the doped region 120 may completely surround the body region 118 beneath the second electrode 140. The doped region 120 may include further portions having different widths around the body region 118.

In one embodiment, one or more dopant block regions 370 may be arranged in the device layer 112. In one embodiment, a dopant block region 370 may be an intrinsic region of the semiconductor layer. In another embodiment, a dopant block region 370 may be a shallow trench isolation region. Referring to FIG. 3B, dopant block regions 370 may be arranged adjacent to the doped region 120 in the device layer 112. In one embodiment, a dopant block region 370 may abut the side surface 125 of the first portion 120a, the side surface 124 of the second portion 120b, the side surface 329 of the third portion 120c of the doped region 120.

Figure 3C:
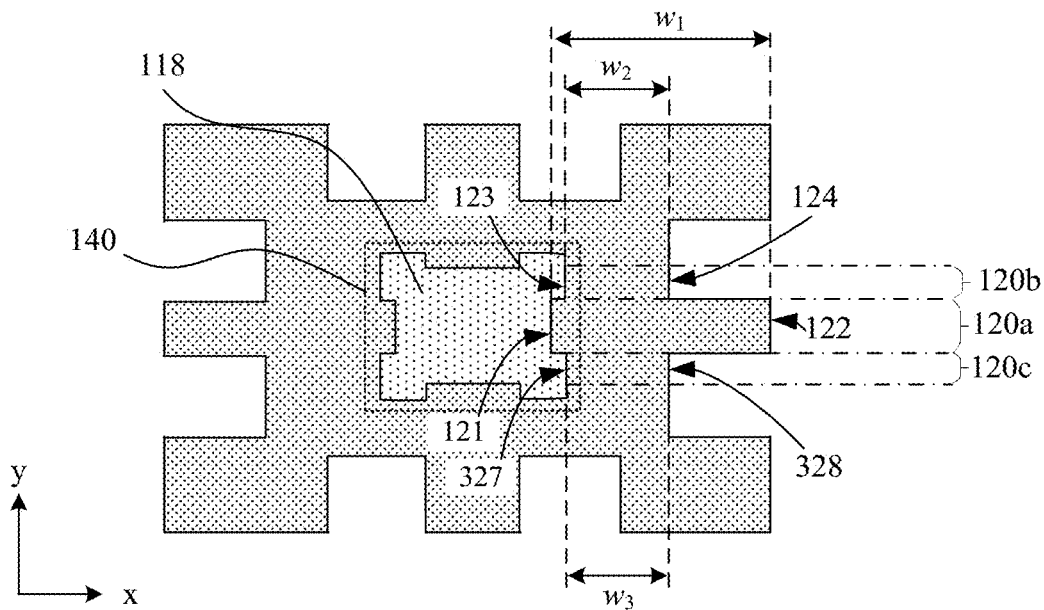
Figure 3D:
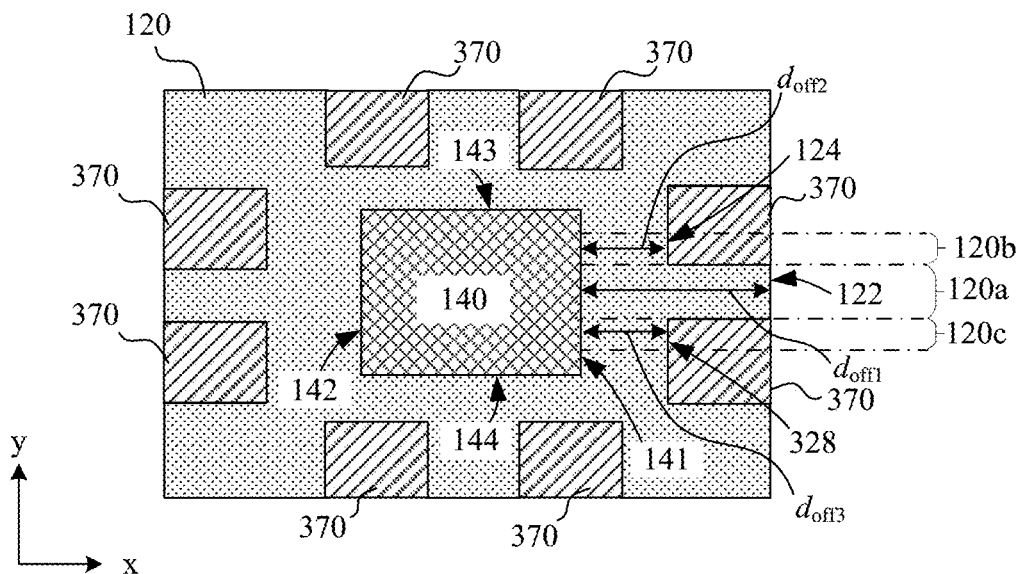

In another embodiment, the third portion 120c may be adjacent to the first portion 120a as illustrated in FIGS. 3C and 3D. The third portion 120c may extend laterally from the first portion 120a. The third portion 120c, for example, may extend from the first portion 120a in a third direction (e.g., along the y-axis direction in FIGS. 3C and 3D). The third direction, for example, may be opposite to the first direction. The first portion 120a, in one embodiment, may be positioned between the second portion 120b and the third portion 120c. The first, second and third portions 120a, 120b and 120c of the doped region 120 each may partially underlap the second electrode 140. As illustrated in FIG. 3C, the side surface 121 of the first portion 120a, the side surface 123 of the second portion 120b and the side surface 327 of the third portion 120c underlaps the second electrode 140. The side surface 122 of the first portion 120a, the side surface 124 of the second portion 120b and the side surface 328 of the third portion 120c does not underlap the second electrode 140. The first portion 120a may have a first width $w_1$ taken from the side surface 121 to the side surface 122 of the first portion 120a, the second portion 120b may have a second width $w_2$ taken from the side surface 123 to the side surface 124 of the second portion 120b, and the third portion 120c may have a third width $w_3$ taken from the side surface 327 to the side surface 328 of the third portion 120c. The first width $w_1$, the second width $w_2$ and the third width $w_3$ may be taken in the second direction (along the x-axis direction). In one embodiment, the first width $w_1$ of the first portion 120a may be greater than each of the second width $w_2$ of the second portion 120b and the third width $w_3$ of the third portion 120c. In one embodiment, the side surface 122 of the first portion 120a, the side surface 124 of the second portion 120b and a side surface 332 of the third portion 120c may be laterally offset from a sidewall of the second electrode 140 by different distances. Referring to FIG. 3D, the side surface 122 of the first portion 120a may be laterally offset from sidewall 141 of the second electrode 140 by a first offset distance $d_{off1}$, the side surface 124 of the second portion 120b may be laterally offset from the sidewall 141 of the second electrode 140 by a second offset distance $d_{off2}$, and the side surface 328 of the third portion 120c may be laterally offset from the sidewall 141 of the second electrode 140 by a third offset distance $d_{off3}$. The side surface 122 of the first portion 120a may be laterally offset from the sidewall 141 of the second electrode 140 at a greater distance than each of the side surface 124 of the second portion 120b and the side surface 328 of the third portion 120c. In other words, the first offset distance $d_{off1}$ of the first portion 120a is greater than the second offset distance $d_{off2}$ of the second portion 120b and the third offset distance $d_{off3}$ of the third portion 120c. Referring to FIGS. 3C and 3D, the doped region 120 underlaps each of the sidewalls 141, 142, 143 and 144 of the second electrode 140. The doped region 120 may further include respective portions (e.g., further first, second and third portions) having side surfaces which are laterally offset from the respective sidewalls 142, 143, and 144 of the second electrode 140 by different distances. The further first, second and third portions of the doped region 120 may have different widths around the body region. In one embodiment, the doped region 120 may completely surround the body region 118 beneath the second electrode 140. When viewed in a plan view as shown in FIGS. 3C and 3D, the doped region 120 of the first electrode for example may have the shape of a comb, with a plurality of electrode fingers. The plurality of electrode fingers may be arranged around the sidewalls 141, 142, 143 and 144 of the second electrode 140. Referring to FIG. 3D, dopant block regions 370 may be arranged adjacent to the doped region 120 in the device layer 112. One of the dopant block regions 370 may abut the first portion 120a and the second portion 120b, and another one of the dopant block regions 370 may abut the first portion 120a and the third portion 120c.

Figure 4:
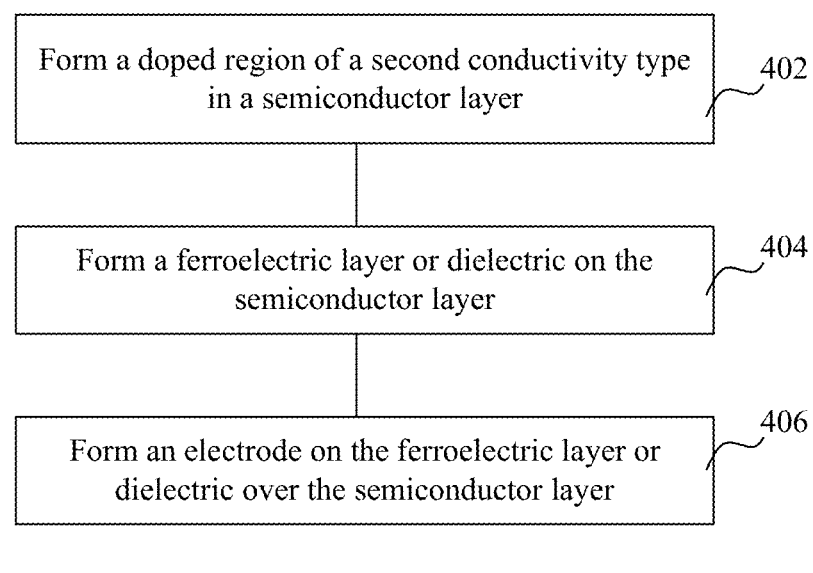
FIG. 4 shows an exemplary process flow for forming a structure.

FIG. 4 shows an exemplary process flow 400 for forming a structure. The structure, for example, is similar to that described in FIGS. 1A-1D, 2A-2D and 3A-3D. As such, common elements may not be described or described in detail.

At 402, a doped region of a second conductivity type may be formed in a semiconductor layer. The doped region may be formed adjacent to a body region of a first conductivity type in the semiconductor layer. The doped region may include a first portion and a second portion extending laterally from the first portion. The first portion may have the first width and the second portion may have the second width. The first width may be greater than the second width. In one embodiment, the doped region may serve as a first electrode of a memory structure. In some embodiments, a second doped region of the second conductivity type may be further formed in the semiconductor layer. The body region may be between the doped region and the second doped region. The second doped region, for example, may be formed in the same step (e.g., simultaneously) as the doped region. In some embodiments, the second doped region may include a first portion and a second portion extending laterally from the first portion. The first portion may have the third width and the second portion may have the fourth width. The third width may be greater than the fourth width. In some embodiments, the doped region and the second doped region may serve as the first electrode of a memory structure.

At 404, in one embodiment, a ferroelectric layer may be formed on the semiconductor layer. The ferroelectric layer may be formed over the body region. The ferroelectric layer, for example, may be formed by atomic layer deposition. In another embodiment, a dielectric may be formed on the semiconductor layer over the body region. The dielectric, in some embodiments, may be a dielectric stack having multiple layers of dielectric.

At 406, an electrode may be formed on the ferroelectric layer over the semiconductor layer. The first portion and the second portion of the doped region may partially underlap the electrode. In the case where the doped region, or the doped region and the second doped region, serves as the first electrode of the memory structure, the electrode formed on the ferroelectric layer may serve as the second electrode of the memory structure. In other embodiments where a dielectric is formed on the semiconductor layer over the body region, the electrode may be formed on the dielectric.

Figure 5A:
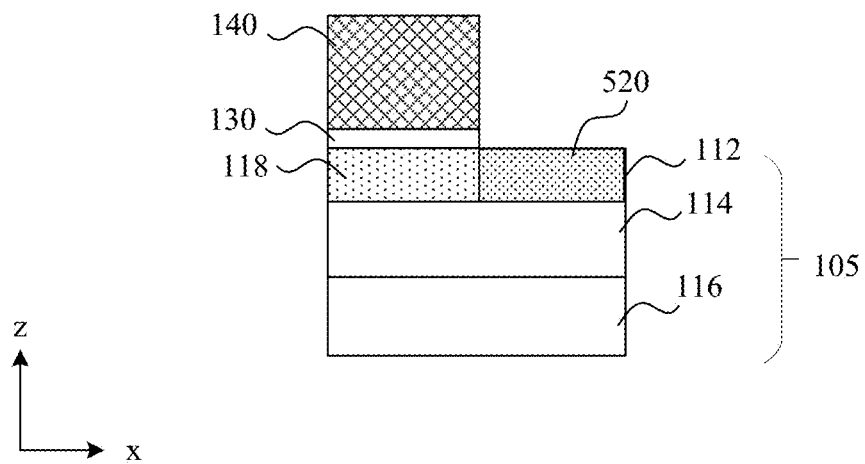
FIGS. 5A-5B and 6A-6B show an exemplary process for forming a structure.
Figure 5B:
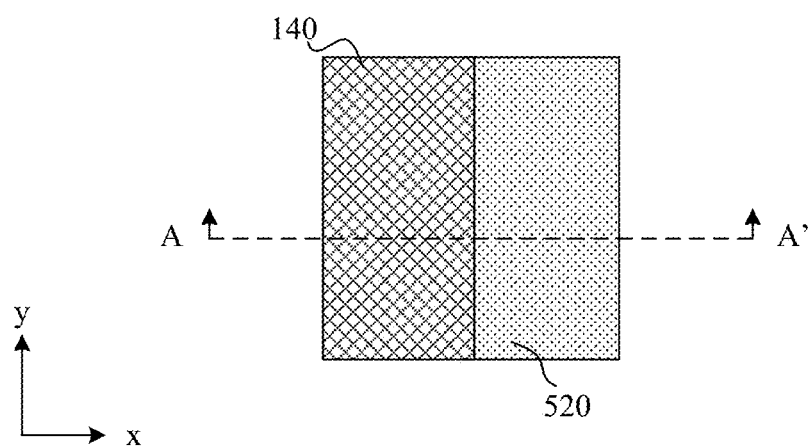
Figure 6A:
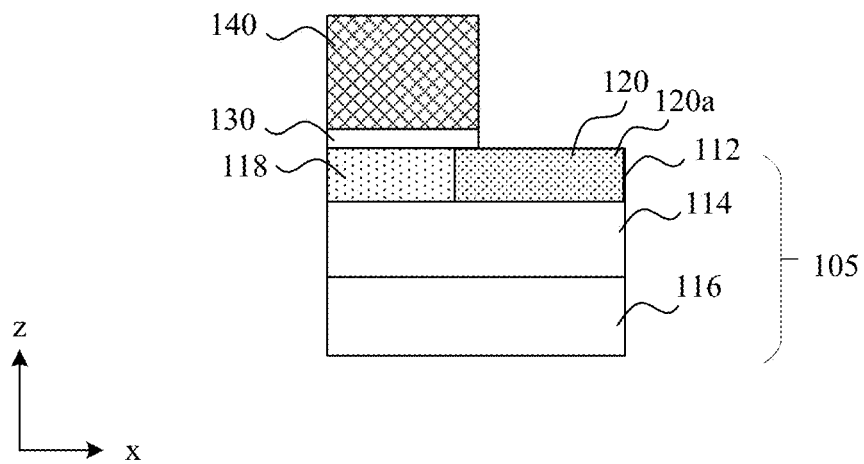
Figure 6B:
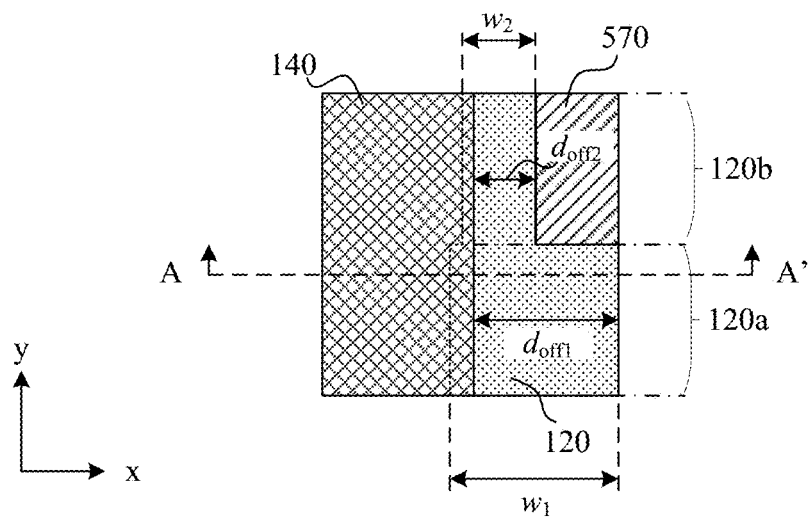

In some embodiments, the doped region may be formed after the step of forming the electrode over the semiconductor layer. In one embodiment, the doped region may be formed, for example, by selectively implanting ions with an implant mask having openings defining an intended location for the doped region in the device layer, and subsequently removing portion(s) (e.g., by etching) of the initial doped region to form the doped region having the first portion and the second portion (e.g., L-shape configuration). FIGS. 5A-5B and 6A-6B show an exemplary process 500 for forming a structure. The structure, for example, is similar to that described in FIGS. 1A-1D, 2A-2D, 3A-3D and 4. As such, common elements may not be described or described in detail. The structure shown in FIG. 5A, for example, may correspond to a section taken along line A-A' in FIG. 5B, and the structure shown in FIG. 6A, for example, may correspond to a section taken along line A-A' in FIG. 6B. For example, FIGS. 5A-5B show cross-sectional and top views, respectively, of the structure at a stage where the ion implantation in the semiconductor layer has been performed to form an initial doped region 520. A portion of the initial doped region 520 may be removed to form a second portion 120b of the doped region 120 having a second width $w_2$ which is less than the first width $w_1$ of the first portion 120a of the doped region 120. Referring to FIG. 6B, a shallow trench isolation (STI) 570 may be formed in the removed portion of the initial doped region 520. An anneal may be performed, forming the doped region 120 having the first portion 120a and the second portion 120b which underlaps the second electrode 140 due to lateral diffusion of dopants (e.g., forming a laterally diffused doping profile) from the initial doped region 520. The second portion 120b of the doped region 120 may be laterally diffused to a lesser extent beneath the second electrode 140 than the first portion 120a of the doped region 120 during the anneal process, producing a corner 160 beneath the second electrode 140 as described with respect to FIG. 1D. The process 500 may continue with forming interconnects for the memory structure.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A structure for a non-volatile memory device, comprising:
   a semiconductor layer having a body region of a first conductivity type;
   a first electrode including a doped region of a second conductivity type in the semiconductor layer, the doped region is adjacent to the body region, the doped region comprises a first portion and a second portion extending laterally from the first portion, wherein the first portion has a first width and the second portion has a second width, the first width is greater than the second width;
   a ferroelectric layer on the semiconductor layer over the body region; and
   a second electrode on the ferroelectric layer, wherein the first portion and the second portion of the doped region partially underlap the second electrode, and a first side surface of the first portion and a first side surface of the second portion of the doped region does not underlap the second electrode.

2. The structure of claim 1, wherein the second portion extends from the first portion in a first direction and the first width and the second width are taken in a second direction.

3. The structure of claim 2, wherein the first direction and the second direction are parallel to a top surface of the semiconductor layer.

4. The structure of claim 2, wherein the second direction is perpendicular to the first direction.

5. The structure of claim 1, wherein the first side surface of the first portion and the first side surface of the second portion are laterally offset from a sidewall of the second electrode by different distances.

6. The structure of claim 1, wherein the first side surface of the second portion adjoins a second side surface of the first portion to form an edge portion of the doped region.

7. The structure of claim 6, wherein the first side surface of the second portion, the second side surface of the first portion and the edge portion of the doped region does not underlap the second electrode.

8. The structure of claim 1, wherein the first portion and the second portion of the doped region constitute an L-shaped configuration.

9. The structure of claim 1, further comprising a contact disposed over the first portion of the doped region.

10. The structure of claim 1, wherein the doped region is adjacent to a first sidewall of the second electrode, and the first electrode further comprises a second doped region in the semiconductor layer adjacent to a second sidewall opposite to the first sidewall of the second electrode, the second doped region is of the second conductivity type.

11. The structure of claim 10, wherein the second doped region comprises a first portion and a second portion extending laterally from the first portion, wherein the first portion has a third width and the second portion has a fourth width, the third width is greater than the fourth width, and the first portion and the second portion of the second doped region partially underlap the second electrode.

12. The structure of claim 11, wherein the doped region and the second doped region are commonly coupled.

13. The structure of claim 1, wherein the doped region further comprises a third portion, the second portion is between the first portion and the third portion, the third portion has a third width, wherein the third width is greater than the second width.

14. The structure of claim 13, wherein the first side surface of the first portion and a first side surface of the third portion are laterally offset from a sidewall of the second electrode by a greater distance than the first side surface of the second portion of the doped region.

15. The structure of claim 1, wherein the second electrode has at least first and second opposing sidewalls, and third and fourth opposing sidewalls, and the doped region underlaps each of the first, second, third and fourth sidewalls of the second electrode.

16. The structure of claim 1, wherein the doped region further comprises a third portion extending laterally from the first portion, the third portion has a third width, wherein the first width is greater than the third width, and the third portion of the doped region partially underlaps the second electrode.

17. A structure for a non-volatile memory device, comprising:
- a semiconductor layer having a body region of a first conductivity type;
- a doped region of a second conductivity type in the semiconductor layer, the doped region is adjacent to the body region, the doped region comprises a first portion and a second portion extending laterally from the first portion, wherein the first portion has a first width and the second portion has a second width, the first width is greater than the second width;
- a dielectric on the semiconductor layer over the body region; and
- an electrode on the dielectric, wherein the first portion and the second portion of the doped region partially underlap the electrode, and a first side surface of the first portion and a first side surface of the second portion of the doped region does not underlap the electrode.

18. The structure of claim 17, wherein the second portion extends from the first portion in a first direction and the first width and the second width are taken in a second direction.

19. The structure of claim 17, wherein the first direction and the second direction are parallel to a top surface of the semiconductor layer.

20. A method of forming a structure, comprising:
- forming a first electrode including a doped region of a second conductivity type in a semiconductor layer, the doped region is adjacent to a body region of a first conductivity type in the semiconductor layer, the doped region comprises a first portion and a second portion extending laterally from the first portion, wherein the first portion has a first width and the second portion has a second width, the first width is greater than the second width;
- forming a ferroelectric layer on the semiconductor layer over the body region; and
- forming a second electrode on the ferroelectric layer, wherein the first portion and the second portion of the doped region partially underlap the second electrode, and a first side surface of the first portion and a first side surface of the second portion of the doped region does not underlap the second electrode.

* * * * *